(12) United States Patent
Zhu et al.

(10) Patent No.: US 6,841,483 B2
(45) Date of Patent: Jan. 11, 2005

(54) UNIQUE PROCESS CHEMISTRY FOR ETCHING ORGANIC LOW-K MATERIALS

(75) Inventors: Helen H. Zhu, Fremont, CA (US); James R. Bowers, Brookfield, CT (US); Ian J. Morey, Singapore (SG); Wayne Babie, Poughkeepsie, NY (US); Michael Goss, Mendon, MA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/782,185

(22) Filed: Feb. 12, 2001

(65) Prior Publication Data

US 2002/0111036 A1 Aug. 15, 2002

(51) Int. Cl.$^7$ .............................................. H01L 21/302
(52) U.S. Cl. ..................... 438/710; 438/714; 438/723
(58) Field of Search ................................ 438/689, 706, 438/710, 711, 712, 714, 723, 724

(56) References Cited

U.S. PATENT DOCUMENTS

| | | | | |
|---|---|---|---|---|
| 5,741,396 A | * | 4/1998 | Loewenstein | 438/724 |
| 5,970,376 A | | 10/1999 | Chen | 438/637 |
| 6,037,255 A | * | 3/2000 | Hussein et al. | 438/647 |
| 6,040,248 A | | 3/2000 | Chen et al. | 438/725 |
| 6,080,529 A | * | 6/2000 | Ye et al. | 430/311 |
| 6,153,511 A | * | 11/2000 | Watatani | 438/623 |
| 6,174,796 B1 | * | 1/2001 | Takagi et al. | 438/622 |
| 6,194,128 B1 | * | 2/2001 | Tao et al. | 216/41 |
| 6,245,663 B1 | | 6/2001 | Zhao et al. | 438/622 |
| 6,352,918 B1 | * | 3/2002 | Huang et al. | 438/623 |
| 2001/0024769 A1 | | 9/2001 | Donoghue et al. | 430/329 |
| 2002/0081855 A1 | | 6/2002 | Jiang et al. | 438/694 |

FOREIGN PATENT DOCUMENTS

| JP | 09036089 | 2/1997 | ....... H01L/21/3065 |
|---|---|---|---|

OTHER PUBLICATIONS

Plummer et al. "Silicon VLSI Technology", Prentice Hall, 2000, p. 639.*

U.S. Appl. No. 09/782,678, entitled "Post–Etch Photoresist Strip with O2 and NH3 for Organosilicate Glass Low–K Dielectric Etch Applications", filed Feb. 12, 2001.

U.S. Appl. No. 09/782,446, entitled "Use of Ammonia for Etching Organic Low–K Dielectrics", filed Feb. 12, 2001.

U.S. Appl. No. 09/782,437, entitled "Use of Hydrocarbon Addition for the Elimination of Micromasking during Etching of Organic Low–K Dielectrics", filed Feb. 12, 2001.

Eto et al., "High Selectivity Photoresist Ashing by the Addition of NH$_3$ to CF$_4$/O$_2$ or CHF$_3$/O$_2$", SID 99 Digest, pp. 844–847.

Delsol et al., "Transformer Coupled Plasma Dielectric Etch for 0.25 $\mu$m Technologies", Elsevier, Microelectronic Engineering 50 (2000), pp. 75–80.

International Search Report, Nov. 20, 2002.

* cited by examiner

*Primary Examiner*—Kin-Chan Chen
(74) *Attorney, Agent, or Firm*—Beyer Weaver & Thomas, LLP

(57) ABSTRACT

Method for etching a feature in an integrated circuit wafer with minimized effect of micromasking. The method introduces a flow of etchant gas including a fluorocarbon gas to the wafer, and uses the etchant gas to form a plasma in proximity with at least a portion of the wafer. The plasma is used to etch at least a portion of the feature in the wafer. Disassociation of the fluorocarbon into fluorine and hydrocarbon species performs two functions. The fluorine species prevents or significantly reduces sputtered hardmask components from depositing on the floor of the etched feature during etching. The hydrocarbon species acts to form a passivation layer on the sidewalls of the feature.

13 Claims, 3 Drawing Sheets

UNIQUE PROCESS CHEMISTRY FOR ETCHING ORGANIC LOW-K MATERIALS

RELATED APPLICATIONS

This application is related to the commonly assigned U.S. patent application Ser. No.: 09/782,678 pending entitled POST-ETCH PHOTORESIST STRIP WITH O2 AND NH3 FOR ORGANOSILICATE GLASS LOW-K DIELECTRIC ETCH APPLICATIONS, by Rao V. Annapragada et al., filed concurrently herewith and incorporated herein by reference.

This application is also related to the commonly assigned U.S. patent application Ser. No.: 09/782,446, pending entitled USE OF AMMONIA FOR ETCHING ORGANIC LOW-K DIELECTRICS, by Chok W. Ho et al., filed concurrently herewith and incorporated herein by reference.

This application is also related to the commonly assigned U.S. patent application Ser. No.: 09/782,437 pending entitled USE OF HYDROCARBON ADDITION FOR THE ELIMINATION OF MICROMASKING DURING ETCHING OF ORGANIC LOW-K DIELECTRICS, by Chok W. Ho, filed filed concurrently herewith and incorporated herein by reference.

FIELD OF THE INVENTION

The present invention relates to semiconductor manufacture. More particularly, the present invention relates to the etching of organic low-k dielectrics in semiconductor wafers.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-k materials", have been developed. Many of these new dielectrics are organic compounds. In the specification and claims, a low-k material is defined as a material with a dielectric constant "k" that is less than 3.

Low-k materials include, but are specifically not limited to: benzocyclobutene or BCB; Flare™ manufactured by Allied Signal® of Morristown, N.J., a division of Honeywell, Inc., Minneapolis, Minn.; one or more of the Parylene dimers available from Union Carbide® Corporation, Danbury Conn.; polytetrafluoroethylene or PTFE; and SiLK®. One PTFE suitable for IC dielectric application is SPEEDFILM™, available from W. L. Gore & Associates, Inc, Newark, Del. SiLK®, available from the Dow® Chemical Company, Midland, Mich., is a silicon-free BCB.

During semiconductor wafer processing, features of the semiconductor device are defined in the wafer using well-known patterning and etching processes. In these processes a photoresist (PR) material is deposited on the wafer and then is exposed to light filtered by a reticle. The reticle is generally a glass plate that is patterned with exemplary feature geometries that blocked light from propagating through the reticle.

After passing through the reticle, the light contacts the surface of the photoresist material. The light changes the chemical composition of the photoresist material such that a developer can remove a portion of the photoresist material. In the case of positive photoresist materials the exposed regions are removed, and in the case of negative photoresist materials the unexposed regions are removed. Thereafter the wafer is etched to remove the underlying material from the areas that are no longer protected by the photoresist material and thereby define the desired features in the wafer. Low-K organic polymers in general can be etched by oxidation (e.g. oxygen-based) or reduction (e.g. hydrogen-based) chemical processes.

The etching of dielectrics may be advantageously accomplished in a dual-frequency capacitively-coupled, (DFC) dielectric etch system. One such is Lam® Research model 4520XLE™ and Exelan-HP™, available from Lam® Research Corporation, Fremont Calif. The 4520XLE™ system processes an extremely comprehensive dielectric etch portfolio in one system. Processes include contacts and vias, bilevel contacts, borderless contacts, nitride and oxide spacers, and passivation.

Advanced etch systems like the 4520XLE™ perform several processes in the same system. By performing many different semiconductor fabrication steps in a single system, wafer throughput can be increased. Even further advanced systems contemplate the performance of additional steps within the same equipment. Again by way of example, but not limitation, Lam® Research Corporation's Exelan™ system is a dry etch system capable of performing many process steps in a single apparatus. Exelan™ enables hardmask open, inorganic and organic ARC etch, and photoresist strip to be performed in situ with a single chamber. This system's extensive process portfolio includes all dual damascene structures, contacts, vias, spacers, and passivation etch in doped and undoped oxides and low-k dielectrics required in the sub-0.18 micron environment. Of course, the principles enumerated herein may be implemented in wide variety of semiconductor fabrication systems, and these principles specifically contemplate all such alternatives.

As used herein, the term in situ refers to one or more processes performed on a given substrate, such as a silicon wafer, in the same piece of semiconductor fabrication equipment without removing the substrate from the equipment.

Many current integrated circuit fabrication technologies utilize a photoresist stripping step following one or more of the patterning steps used to form the features in the wafer. Because many photoresists have similar chemical compositions with respect to low-k dielectrics, especially organic low-k dielectrics, such as SiLK, in order to ensure good profile control during the etching of a feature in a wafer, a hard mask is often employed beneath the photoresist.

An example wafer stack incorporating a hard mask layer is shown at FIG. 1a. The wafer, 1, having a patterned layer of photoresist, 10, is shown. In this example, wafer 1 includes a silicon substrate, 22 having deposited thereon a silicon carbide or silicon nitride barrier layer, 20. Deposited over barrier layer 20 is a layer 14 of an organic low-k dielectric, for instance Dow Corning Silk™. A metalized structure, not shown, may be formed under the barrier layer. A hard mask layer is deposited over organic low-k layer 14, completing the exemplar wafer stack. Hard mask may be formed of SiO2, Si3N4, or other hard mask materials. Patterned photoresist layer 10, previously discussed, is applied over hard mask 12. Of course, it will be recognized by those having skill in the art that this wafer stack is exemplary only. Alternative structures and films, known to those having skill in the art may be utilized to implement alternative integrated circuit designs.

Having reference now to FIG. 1b, as etching proceeds, especially the etching of the organic low-k dielectric layer, such as SiLK, as shown in FIG. 1b, photoresist layer 10 is etched away, exposing portions of hard mask layer 12, beneath. As etching continues, ion bombardment of the hard mask layer also etches away a portion of hard mask layer 12, for instance at 30. Some of the hard mask material so etched away is re-deposited, for instance by sputtering, on surfaces of the wafer and may also be re-deposited on surfaces of the reaction chamber. At least some of this material, 32, is further deposited at the bottom of etched features during etching, as shown at 36, and in section "A". The amount of micromasking increases with increased RF power during etching.

Section "A" is enlarged at FIG. 1c. With reference to that figure, a feature, for instance 26, is shown being etched through the organic low-k dielectric layer 14, such as SiLK. The hard mask material re-deposited at 36 is seen in photomicrographs to form spicules 34 of hard mask material. The visual appearance of this material gives rise to one nickname therefor: "grass", and it is the sputtered hard mask that micromasks the SiLK, which forms the "grass". The micromask of course not only slows the etch rate of the feature, but it can render the etching of the feature erratic and irregular, leading in extreme cases to poor profile control and yield reduction.

What is desirable is a methodology which mitigates, and preferably eliminates the formation of grass during etching of features in integrated circuits while maintaining CD (critical dimension) control during that etching.

What is further desirable is that the process be capable of providing good profile control during etching by providing sidewall passivation, minimizing lateral etching of the organic low-k material. The methodology should enable vertical to positively sloped features in organic low-k materials.

What is further desirable is a process which could reduce the unwanted erosion of photoresist during etching.

What is further desirable is a process, which could protect the hard mask once it is exposed to the plasma due to the clearing of the photoresist.

What is also desirable is a methodology which is functional across a broad range of etch plasma densities.

In order to facilitate further wafer processing and overall device quality, it is desirable that the methodology provide residue-free surfaces.

In order to maintain a high wafer throughput, what is also desirable is that the methodology be capable of being performed in situ within the fabrication equipment utilized to form the wafer.

Finally, it would be very desirable if the these advantages could be implemented using existing integrated circuit manufacturing equipment.

These and other features of the present invention will be described in more detail in the section entitled detailed description of the preferred embodiments and in conjunction with the following figures.

SUMMARY OF THE INVENTION

The present invention teaches the addition of a fluorocarbon addition during etching to reduce both the sputtering rate of inorganic hardmask material and also the etch rate of the photoresist mask. The invention may provide sidewall protection, which may provide CD and profile control and may eliminate residue formation even when high radio frequency power is used.

Several sources of appropriate fluorocarbon are identified as suitable to practice the present invention. These include, but are specifically not limited to: methyl fluoride CH3F, difluoromethane CH2F2, and trifluoromethane CHF3.

BRIEF DESCRIPTION OF THE DRAWING

For more complete understanding of the present invention, reference is made to the accompanying Drawing in the following Detailed Description of the Preferred Embodiments. In the drawing.

Figure 1A:
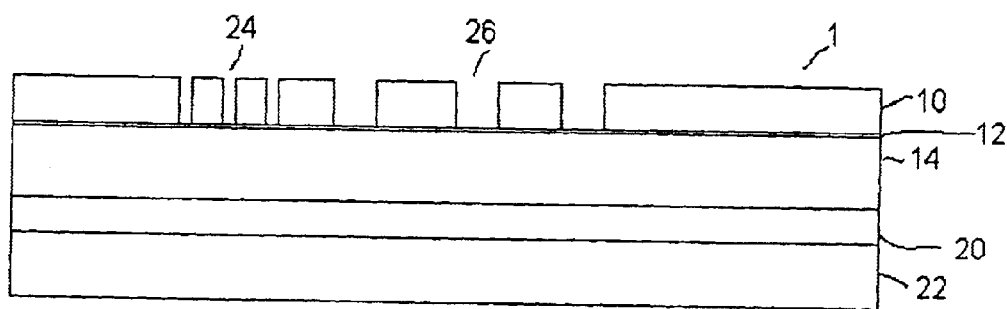
FIG. 1a is a cross-section through a test wafer having applied thereto a patterned layer of photoresist prior to etching.
Figure 1B:
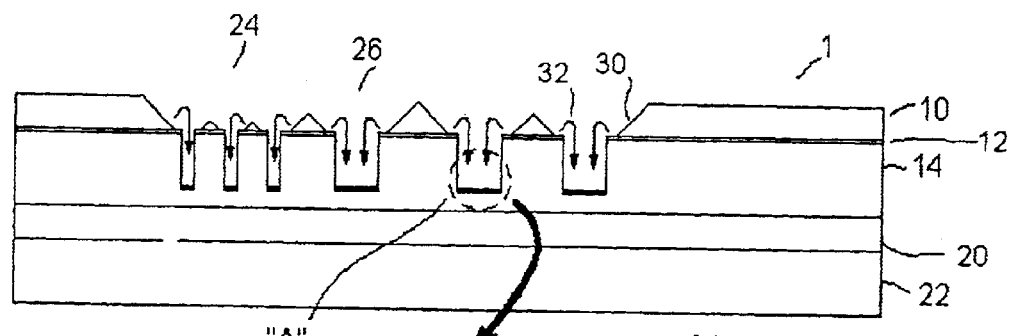
FIG. 1b is a cross-section through the test wafer following the etch step in the prior art.
Figure 1C:
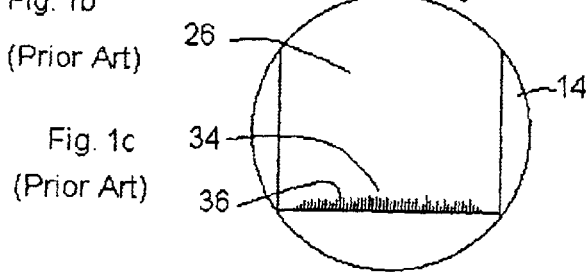
FIG. 1c is an enlarged sectional view of part of the wafer as shown in FIG. 1b.

Reference numbers refer to the same or equivalent parts of the invention throughout the several figures of the Drawing.

DETAILED DESCRIPTION OF THE PREFERRED EMBODIMENTS

The present invention teaches a novel etch chemistry incorporating a fluorocarbon for etching a wide variety of feature sizes and shapes in wafers incorporating low-k dielectrics, especially dielectrics of an organic material, such as SiLK. The methodology taught herein eliminates the formation of micromasking from sputtered hardmask components during etching. The methodology taught herein further results in minimal RIE lag, minimal bowing of the vias and trenches formed by the etch process, good etch profiles, good resist selectivity, good etch rates, good CD control, and good etch uniformity across the wafer.

In order to etch a variety of features, including but specifically not limited to trenches and vias, in wafers including organic low-k dielectric, such as SiLK, layers the present invention implements the use of a fluorocarbon, for instance CH3F, methyl fluoride, as an adjunct during etching. The invention may provide a CH3F/H2/N2 etchant gas, or a CH3F/NH3 etchant gas, or a CH3F/O2/N2 etchant gas.

Figure 2:
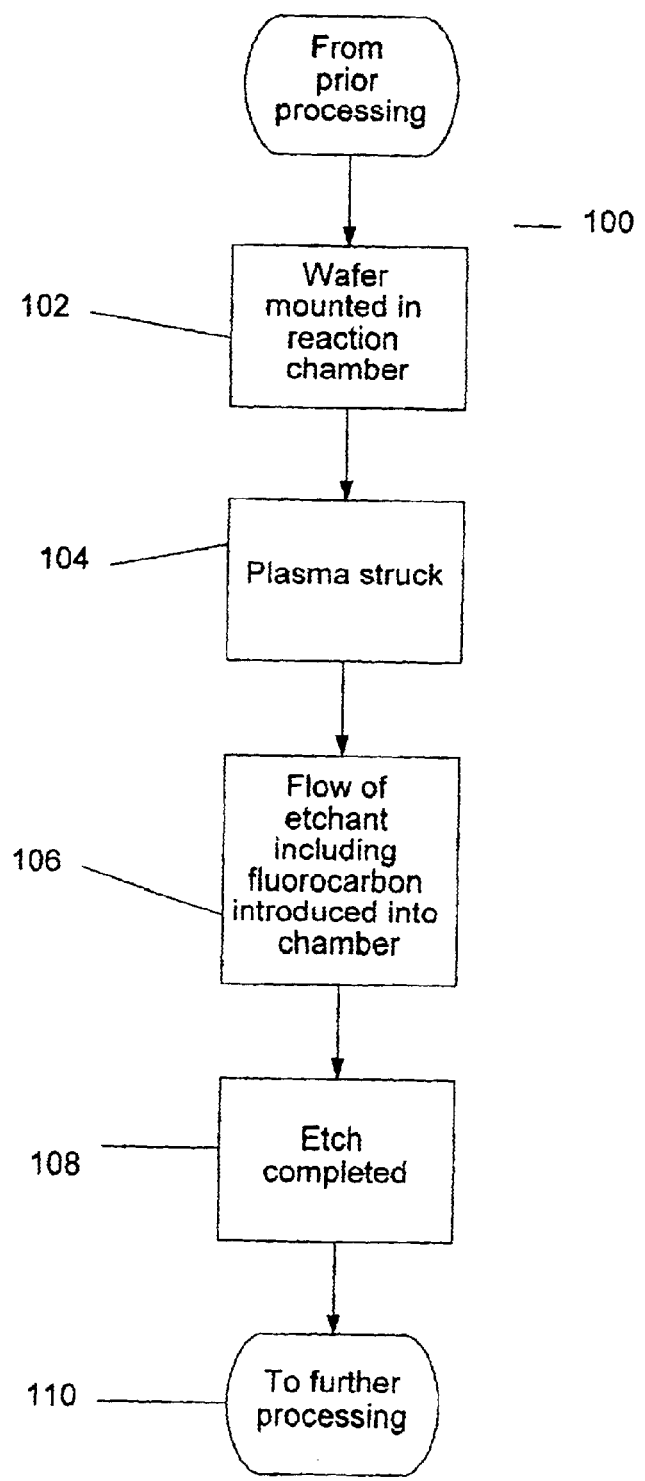
FIG. 2 is an overview flowchart of a process for etching a layer of organic low-k dielectric as part of an integrated circuit device.

Having reference to FIG. 2, in order to practice the process, 100, of the present invention a wafer is situated within a reaction vessel capable of forming and etch plasma. This reaction vessel or chamber may be an item of single purpose etching equipment, or may be a multiple purpose wafer processing system. One equipment particularly well suited for practicing the present invention is the Exelan™ system dry etch system, available from Lam Research Corporation, Fremont, Calif. Exelan™ is capable of performing hardmask open, inorganic and organic ARC etch, and photoresist strip in situ within a single chamber. Alternative equipment may of course be utilized.

The wafer, previously having had a layer of patterned photoresist applied to let upper surface thereof, is mounted within the chamber at 102, and an etch plasma struck at 104. A flow of etchant gas is introduced into the chamber at 106. The etchant includes at least one fluorocarbon including, but specifically not limited to those selected from the group consisting of methyl fluoride CH3F, difluoromethane CH2F2, and trifluoromethane CHF3. The active etchant may comprise oxygen, hydrogen, nitrogen, ammonia or other etchants effective for the particular dielectric being etched.

Once the desired feature has been completed, at 108, the wafer is available for further processing as required.

While the succeeding discussion of certain preferred embodiments are centered around a single etching step, it will be understood by those having skill in the art that the present invention may conveniently be implemented as part of a multi-step etch regime. The present invention specifically contemplates all such multi-step etch regimes, including dielectric etch regimes, incorporating the principles enumerated herein.

Figure 3A:
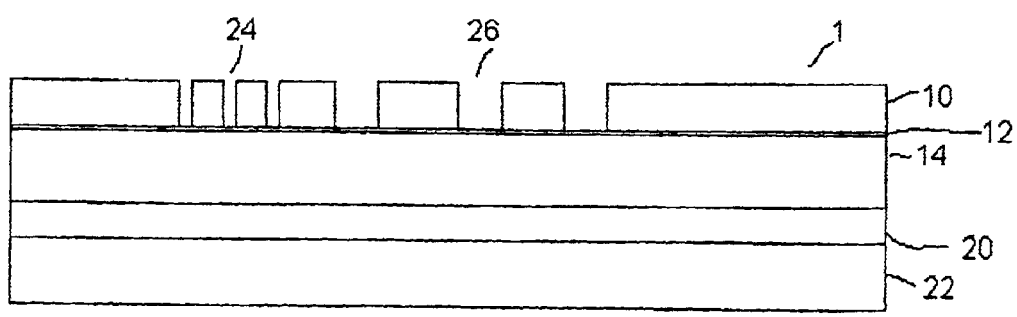
FIG. 3a is a cross-section through a test wafer having applied thereto a patterned layer of photoresist prior to etching in a preferred embodiment of the invention.

Having reference now to FIG. 3a, an example wafer, 1, having a patterned layer of photoresist, 10, is shown. In this example, wafer 1 includes a silicon substrate, 22 having deposited thereon a silicon carbide or silicon nitride barrier layer, 20. Deposited over barrier layer 20 is a layer 14 of organic low-k dielectric, for instance Dow® Chemical Company Silk™. A metalized structure, not shown, may be formed under the barrier layer, such as silicon carbide or silicon nitride. A hard mask layer, 12, of SiO2 is deposited over organic low-k layer 14, completing the example in wafer stack. Patterned photoresist layer 10, previously discussed, is applied over hard mask 12. Of course, it will be recognized by those having skill in the art that this wafer stack is exemplary only. Alternative structures and films, known to those having skill in the art may be utilized to implement alternative integrated circuit designs.

At 102 the wafer is situated within the reaction chamber. At 104 the etch plasma is struck. At 106 a flow of an etchant gas including a fluorocarbon is introduced into the chamber of the dual-frequency etch equipment previously discussed so that a plasma is formed from the etchant gas. According to one embodiment, this etchant gas is a mixture including nitrogen, N2, hydrogen, H2, and methyl fluoride, CH3F. This mixture is of course highly application specific, and alternative etch steps implementing alternative active etchants and diluents with a fluorocarbon additive may be used either before or after an etch step incorporating the fluorocarbon according to the present invention.

According to one embodiment of the present invention, the etch step is conducted at a chamber pressure of between 0 and 500 mTorr, more preferably between 10 and 250 mTorr, more preferably still between 20 and 160 mTorr, and most preferably at about 130 mTorr.

The upper frequency of the plasma is formed at power levels from about 100W to about 2500W. More preferably, the upper power level is formed from about 250W to about 1500W. More preferably still, this power level is set at between about 500 to about 1500W. Most preferably the upper frequency power is set at about 1000W. In this embodiment, a 27 MHz power source is used to provide the upper frequency power levels.

The lower frequency power level is set at power levels from about 0W to about 2500W. More preferably, the lower power level is formed from about 0W to about 1000W. More preferably still, this power level is set at between about 0W to about 100W. Most preferably the lower frequency power is set at about 0W. In this embodiment of the invention, a 2 MHz power source is used to provide the lower frequency power levels.

The mixture of the etchant gas is preferably comprised of flows of the constituent etch gasses. These include hydrogen, H2, at flows from about 3 sccm to about 1000 sccm, more preferably from about 25 sccm to about 500 sccm, more preferably still from about 50 sccm to about 350 sccm and most preferably at about 250 sccm.

This etchant gas also contains nitrogen, N2, as a diluent, at flows from about 0 sccm to about 2500 sccm, more preferably from about 50 sccm to about 1250 sccm, more preferably still from about 100 sccm to about 1000 sccm and most preferably at about 750 sccm.

The etchant further includes a flow of methyl fluoride CH3F, from about 0.5 sccm to about 50 sccm, more preferably from about 1 sccm to about 30 sccm, more preferably still from about 2 sccm to about 10 sccm and most preferably at about 3 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferably at about 40° C.

Figure 3B:
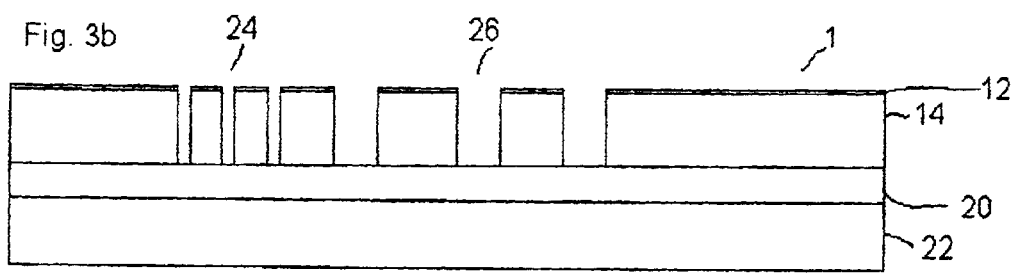
FIG. 3b is a cross-section through the test wafer following a third etch step employing present invention as a final etchant to form the feature.

In order to accomplish the preceding temperature control, the temperature of the wafer is thermally maintained by a flow of coolant gas through the chuck, sometimes referred to as an electrostatic chuck (ESC), retaining the wafer in the reaction vessel. This flow of coolant gas, for instance helium, is at a flow rate from about 1 sccm to about 100 sccm, more preferably from about 2 sccm to about 50 sccm, more preferably still from about 10 sccm to about 40 sccm and most preferably at about 30 sccm. Etching proceeds until the desired etch results have been met. In this example, the etch step proceeds until the etch reaches barrier 20, as shown at FIG. 3b.

At this point in the etch regime, the features, for instance 24 and 26, defined by photoresist layer 10 have now been etch through the hard mask layer 12, and the organic low-k dielectric layer 14. The feature is completely etched when barrier layer 20 is reached, as shown at FIG. 3b. FIG. 3b also shows the completed etch following removal of photoresist 10. The wafer stack is now ready for further patterning, doping or deposition steps as required to complete the integrated circuit device, as at step 110.

It will be apparent to those having ordinary skill in the art that the previously discussed power levels, pressures, flow rates, and temperatures are by way of example only. Different dielectric materials disposed at varying thicknesses in the wafer stack may require different combinations of power, pressure, flow, and temperature and other process variables. The principles in the present invention specifically contemplate all such combinations.

One such combination forms an alternative embodiment of the present invention. According to this embodiment of the present invention, the etch step is conducted at a chamber pressure of between 0 and 500 mTorr, more preferably between 10 and 250 mTorr, more preferably still between 20 and 160 mTorr, and most preferably at about 50 mTorr.

The upper frequency of the plasma is formed at power levels from about 250W to about 2500W. More preferably, the upper power level is formed from about 250W to about 1500W. More preferably still, this power level is set at between about 300 to about 750W. Most preferably the upper frequency power is set at about 500W.

The lower frequency power level is set at power levels from about 250W to about 2500W. More preferably, the upper power level is formed from about 250W to about 1500W. More preferably still, this power level is set at between about 300 to about 750W. Most preferably the lower frequency power is set at about 500W.

The mixture of the etchant gas is preferably comprised of flows of the constituent etch gasses. These include hydrogen, H2, at flows from about 3 sccm to about 500 sccm, more preferably from about 25 sccm to about 500 sccm, more preferably still from about 50 sccm to about 250 sccm and most preferably at about 100 sccm.

This etchant gas also contains nitrogen, N2, as a diluent, at flows from about 0 sccm to about 2500 sccm, more preferably from about 50 sccm to about 1250 sccm, more preferably still from about 100 sccm to about 500 sccm and most preferably at about 300 sccm.

The etchant further includes a flow of methyl fluoride CH3F, from about 0.5 sccm to about 50 sccm, more preferably from about 1 sccm to about 10 sccm, more preferably still from about 2 sccm to about 7 sccm and most preferably at about 5 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferably at about 40° C.

Etch times may further vary from small fractions of a second to about 10 minutes, and are situation dependent. In the example presented here, etching at the most preferable power settings, gas flows and temperature, the etch was accomplished in about 60 seconds.

Again, to accomplish the preceding temperature control, the temperature of the wafer is thermally maintained by a flow of coolant gas through the chuck. This flow of coolant gas, for instance helium, is at a flow rate from about 1 sccm to about 100 sccm, more preferably from about 2 sccm to about 50 sccm, more preferably still from about 10 sccm to about 40 sccm and most preferably at about 31.1 sccm.

In another embodiment of the present invention, the etch step is conducted at a chamber pressure of between 0 and 500 mTorr, more preferably between 100 and 300 mTorr, more preferably still between 150 and 250 mTorr, and most preferably at about 200 mTorr.

The upper frequency of the plasma is formed at power levels from about 100W to about 1500W. More preferably, the upper power level is formed from about 300W to about 1000W. More preferably still, this power level is set at between about 600 to about 800W. Most preferably the upper frequency power is set at about 700W.

The lower frequency power level is set at power levels from about 0W to about 500W. More preferably, the lower power level is formed from about 0W to about 250W. More preferably still, this power level is set at between about 0 to about 100W. Most preferably the lower frequency power is set at about 0W.

The mixture of the etchant gas is preferably comprised of flows of the constituent etch gasses. These include ammonia, NH3, at flows from about 100 sccm to about 3000 sccm, more preferably from about 500 sccm to about 2000 sccm, more preferably still from about 750 sccm to about 1500 sccm and most preferably at about 1000 sccm.

The etchant further includes a flow of methyl fluoride CH3F, from about 0.5 sccm to about 50 sccm, more preferably from about 1 sccm to about 10 sccm, more preferably still from about 2 sccm to about 7 sccm and most preferably at about 5 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferably at about 20° C.

In another embodiment of the present invention, the etch step is conducted at a chamber pressure of between 0 and 300 mTorr, more preferably between 20 and 200 mTorr, more preferably still between 50 and 150 mTorr, and most preferably at about 90 mTorr.

The upper frequency of the plasma is formed at power levels from about 100W to about 1500W. More preferably, the upper power level is formed from about 300W to about 1000W. More preferably still, this power level is set at between about 400 to about 600W. Most preferably the upper frequency power is set at about 500W.

The lower frequency power level is set at power levels from about 0W to about 500W. More preferably, the upper power level is formed from about 100W to about 300W. More preferably still, this power level is set at between about 150 to about 250W. Most preferably the lower frequency power is set at about 200W.

The mixture of the etchant gas is preferably comprised of flows of the constituent etch gasses. These include ammonia, NH3, at flows from about 100 sccm to about 2000 sccm, more preferably from about 200 sccm to about 1000 sccm, more preferably still from about 400 sccm to about 600 sccm and most preferably at about 500 sccm.

The etchant further includes a flow of methyl fluoride CH3F, from about 0.5 sccm to about 70 sccm, more preferably from about 3 sccm to about 30 sccm, more preferably still from about 6 sccm to about 15 sccm and most preferably at about 10 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferaably at about 20° C.

In another embodiment of the present invention, the etch step is conducted at a chamber pressure of between 0 and 300 mTorr, more preferably between 50 and 200 mTorr, more preferably still between 100 and 150 mTorr, and most preferably at about 120 mTorr.

The upper frequency of the plasma is formed at power levels from about 100W to about 1500W. More preferably, the upper power level is formed from about 300W to about 1000W. More preferably still, this power level is set at between about 400 to about 600W. Most preferably the upper frequency power is set at about 500W.

The lower frequency power level is set at power levels from about 100W to about 1500W. More preferably, the upper power level is formed from about 300W to about 1000W. More preferably still, this power level is set at between about 400 to about 600W. Most preferably the lower frequency power is set at about 500W.

This etchant gas also contains argon, Ar, as a diluent, at flows from about 0 sccm to about 800 sccm, more preferably from about 200 sccm to about 600 sccm, more preferably still from about 300 sccm to about 500 sccm and most preferably at about 400 sccm.

This etchant gas also contains nitrogen, N2, as a diluent, at flows from about 0 sccm to about 300 sccm, more preferably from about 50 sccm to about 200 sccm, more preferably still from about 75 sccm to about 150 sccm and most preferably at about 100 sccm.

The mixture of the etchant gas is preferably comprised of flows of the constituent etch gasses. These include oxygen, O2, at flows from about 0 sccm to about 100 sccm, more preferably from about 2 sccm to about 50 sccm, more preferably still from about 3 sccm to about 15 sccm and most preferably at about 6 sccm.

The etchant further includes a flow of methyl fluoride CH3F, from about 0.5 sccm to about 50 sccm, more preferably from about 1 sccm to about 10 sccm, more preferably still from about 2 sccm to about 7 sccm and most preferably at about 5 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferably at about 20° C.

In another embodiment of the present invention, the etch step is conducted at a chamber pressure of between 0 and 400 mTorr, more preferably between 100 and 300 mTorr, more preferably still between 150 and 250 mTorr, and most preferably at about 200 mTorr.

The upper frequency of the plasma is formed at power levels from about 100W to about 3000W. More preferably, the upper power level is formed from about 500W to about 2000W. More preferably still, this power level is set at between about 750 to about 1500W. Most preferably the upper frequency power is set at about 1000W.

The lower frequency power level is set at power levels from about 0W to about 300W. More preferably, the upper power level is formed from about 0W to about 200W. More preferably still, this power level is set at between about 0 to about 100W. Most preferably the lower frequency power is set at about 0W.

This etchant gas also contains helium, He, as a diluent, at flows from about 0 sccm to about 3000 sccm, more preferably from about 600 sccm to about 2000 sccm, more preferably still from about 900 sccm to about 1500 sccm and most preferably at about 1200 sccm.

The mixture of the etchant gas is preferably comprised of flows of the constituent etch gasses. These include oxygen, O2, at flows from about 0 sccm to about 100 sccm, more preferably from about 2 sccm to about 50 sccm, more preferably still from about 3 sccm to about 15 sccm and most preferably at about 6 sccm.

The etchant further includes a flow of methyl fluoride CH3F, from about 0.5 sccm to about 30 sccm, more preferably from about 1 sccm to about 30 sccm, more preferably still from about 2 sccm to about 7 sccm and most preferably at about 3 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferably at about 20° C.

Process 100 provides several novel advantages. First among these is the fact that etching proceeds quickly, without the effects of the previously discussed micromasking slowing the etch down. The etch rate for each of the previously discussed embodiments was generally in excess of 3000 Å/min, given the conditions specified. Of course, alternative embodiments operating of different materials having different thicknesses, or performed with different process parameters, may produce greater or lower etch rates.

A second advantage is the extraordinary degree of control of profile control enabled by the methodology of the present invention.

One advantage noted during testing of the present invention is the notable lack of bowing produced by the etch incorporating a fluorocarbon. During the etching, it is postulated that the fluorocarbon disassociates into fluorine and hydrocarbon species. It is further postulated that where there is insufficient ion bombardment, for instance on the sidewalls of vias and trenches, the disassociated =CH— species reacts with the SiLK and forms a polymer consisting of (=CH—N)= groups arranged in a 3-dimensional matrix. This resultant HCN polymer along with the $CF_x$ polymer directly dissociates from the CH3F, which passivates the sidewall and prevents profile bowing. The deposition of this polymer also forms on the hard mask, which reduces the amount of hard mask being sputtered. The fluorine species combines with the sputtered hard mask components to form volatile compounds which are pumped away, thereby eliminating, or at least seriously reducing the micromasking effect.

A specific feature of the present invention is its novel ability to form features of widely varying size contemporaneously, with excellent profile control and with minimal RIE lag, minimal bowing of the vias formed by the etch process, good etch profiles, good resist selectivity, and good etch uniformity across the wafer.

It will be apparent to those having ordinary skill in the art that the previously discussed power levels, pressures, flow rates, and temperatures are by way of example only. Different dielectric materials disposed at varying thicknesses in the wafer stack may require different combinations of power, pressure, flow, and temperature. The principles in the present invention specifically contemplate all such combinations.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of integrated circuit devices formed of varying wafer stack configurations defined by a number of different layers. The previously discussed process variables are of course capable of modification by those having skill in the art to effect different integrated circuit devices. Each of these alternatives is specifically contemplated by the principles of the present invention.

What is claimed is:

1. A method for etching a feature in an integrated circuit wafer, the wafer incorporating at least one low-k dielectric layer partially disposed below a hardmask, the method comprising:

disposing the wafer within a reaction chamber;

introducing a flow of etchant gas comprising $CH_3F$ and an active etchant into the reaction chamber, wherein a flow ratio of the flow of $CH_3F$ to a total flow of the etchant gas is between about 0.25% and about 2%;

forming a plasma from the etchant gas within the reaction chamber;

etching the feature in at least a portion of the low-k dielectric layer with the active etchant;

sputtering some of the hardmask with the active etchant; and forming a volatile compound from sputtered hardmask and fluorine, thus reducing micromasking.

2. The method, as recited in claim 1, wherein the active etchant is selected from the group consisting of hydrogen and ammonia.

3. The method, as recited in claim 1, wherein the active etchant is ammonia with a flow of about 100 sccm to about 3000 sccm.

4. The method, as recited in claim 3, wherein the low-k dielectric layer is a silicon-free low-k dielectric layer.

5. The method, as recited in claim 3, wherein the low-k dielectric layer is a silicon-free benzocyclobutene low-k dielectric layer.

6. The method, as recited in claim 1, wherein the active etchant is nitrogen and hydrogen.

7. The method, as recited in claim 6, wherein the flow rate of the nitrogen is between about 50 sccm to about 1250 sccm and the flow rate of the hydrogen is about 25 sccm to about 500 sccm.

8. The method, as recited in claim 1, further comprising depositing polymer from the $CH_3F$ on the hardmask to reduce hardmask sputtering.

9. The method, as recited in claim 8, further comprising depositing polymer from the $CH_3F$ on sidewalls of the feature to reduce profile bowing.

10. The method, as recited in claim 1, wherein the low-k dielectric layer is a silicon-free low-k dielectric layer.

11. The method, as recited in claim 1, wherein the low-k dielectric layer is a silicon-free benzocyclobutene low-k dielectric layer.

12. The method, as recited in claim 1, further comprising depositing polymer from the fluorocarbon on sidewalls of the feature to reduce profile bowing.

13. The method, as recited in claim 1, further comprising etching an opening in the hardmask with the active etchant, wherein sputtering some of the hardmask occurs during the etching an opening in the hardmask, and wherein the forming a volatile compound occurs during the etching an opening in the hardmask, wherein the active etchant etches the hardmask opening and wherein the active etchant is selected from the group consisting of hydrogen and ammonia.

* * * * *